(12) United States Patent
Baggett et al.

(10) Patent No.: US 10,128,084 B1
(45) Date of Patent: Nov. 13, 2018

(54) WAFER TEMPERATURE CONTROL WITH CONSIDERATION TO BEAM POWER INPUT

(71) Applicant: Axcelis Technologies, Inc., Beverly, MA (US)

(72) Inventors: John Baggett, Amesbury, MA (US); Joe Ferrara, Georgetown, MA (US); Brian Terry, Amesbury, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 15/707,473

(22) Filed: Sep. 18, 2017

(51) Int. Cl.
| | |
|---|---|
| *H01L 21/67* | (2006.01) |
| *G21K 5/08* | (2006.01) |
| *H01J 37/317* | (2006.01) |
| *H01L 21/265* | (2006.01) |
| *H01J 37/302* | (2006.01) |
| *H01J 37/147* | (2006.01) |
| *G01K 7/22* | (2006.01) |
| *H01J 37/18* | (2006.01) |

(52) U.S. Cl.
CPC .......... *H01J 37/3171* (2013.01); *G01K 7/223* (2013.01); *H01J 37/1471* (2013.01); *H01J 37/185* (2013.01); *H01J 37/3023* (2013.01); *H01L 21/265* (2013.01); *H01J 2237/04735* (2013.01); *H01J 2237/2001* (2013.01); *H01J 2237/31701* (2013.01)

(58) Field of Classification Search
USPC ............ 250/453.11, 492.3, 492.21; 279/106
See application file for complete search history.

(56) References Cited

U.S. PATENT DOCUMENTS

| | | | |
|---|---|---|---|
| 9,236,216 B2 * | 1/2016 | Lee .......................... | H01J 37/18 |
| 9,978,599 B2 * | 5/2018 | Farley ............... | H01L 21/26513 |
| 2014/0034846 A1 * | 2/2014 | Lee .......................... | H01J 37/18 |
| | | | 250/453.11 |
| 2017/0352544 A1 * | 12/2017 | Farley ............... | H01L 21/26513 |

* cited by examiner

*Primary Examiner* — Bernard Souw
(74) *Attorney, Agent, or Firm* — Eschweiler & Potashnik, LLC

(57) ABSTRACT

A system and method is provided maintaining a temperature of a workpiece during an implantation of ions in an ion implantation system, where the ion implantation system is characterized with a predetermined set of parameters. A heated chuck is provided at a first temperature and heats the workpiece to the first temperature. Ions are implanted into the workpiece concurrent with the heating, and thermal energy is imparted into the workpiece by the ion implantation. A desired temperature of the workpiece is maintained within a desired accuracy during the implantation of ions by selectively heating the workpiece on the heated chuck to a second temperature. The desired temperature is maintained based, at least in part, on the characterization of the ion implantation system. Thermal energy imparted into the workpiece from the implantation is mitigated by the selective heating of the workpiece on the heated chuck at the second temperature.

18 Claims, 3 Drawing Sheets

WAFER TEMPERATURE CONTROL WITH CONSIDERATION TO BEAM POWER INPUT

FIELD OF THE INVENTION

The present invention relates generally to ion implantation systems, and more specifically to a system and method of maintaining a temperature of a workpiece concurrent with an ion implantation.

BACKGROUND OF THE INVENTION

Workpiece clamps or chucks, such as electrostatic clamps or chucks (ESCs), are often utilized in the semiconductor industry for clamping workpieces or substrates during plasma-based or vacuum-based semiconductor processes such as ion implantation, etching, chemical vapor deposition (CVD), etc. Clamping capabilities of the ESCs, as well as workpiece temperature control, have proven to be quite valuable in processing semiconductor substrates or wafers, such as silicon wafers. A typical ESC, for example, comprises a dielectric layer positioned over a conductive electrode, wherein the semiconductor wafer is placed on a surface of the ESC (e.g., the wafer is placed on a surface of the dielectric layer). During semiconductor processing (e.g., ion implantation), a clamping voltage is typically applied between the wafer and the electrode, wherein the wafer is clamped against the chuck surface by electrostatic forces.

For certain ion implantation processes, heating of the workpiece via a heating of the ESC is desirable while the workpiece is subjected to an ion beam. As workpiece temperature control and accuracy continue to have greater importance during processing, an impact that the power from the ion beam has on wafer temperature is resulting in less accurate and less stable wafer temperatures, especially with higher-powered ion beams. Thermocouples that are embedded into the ESC for measuring temperature, however, have relatively slow response times, and are often not thermally coupled close enough to the wafer to provide adequate fast and accurate control of heated ESC. While thermocouples that are in contact with the wafer may provide fast temperature measurements, such contact thermocouples are difficult to implement and can result in higher particles and decreased reliability of the ion implantation system.

SUMMARY OF THE INVENTION

The present disclosure provides a system and method for accurately controlling temperatures of a workpiece in an ion implantation system. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one exemplary aspect, an ion implantation system is provided, wherein the ion implantation system comprises an ion source configured to form an ion beam. A beamline assembly is configured to mass analyze the ion beam, and an end station is configured for receiving the ion beam. The end station comprises a heated chuck configured to selectively secure and selectively heat a workpiece during an implantation of ions into the workpiece from the ion beam.

According to one example, a controller is configured to maintain a desired temperature of the workpiece during the implantation of ions into the workpiece. The controller, for example, is configured to selectively heat the workpiece via a control of the heated chuck based, at least in part, on a predetermined characterization of the ion implantation system and a thermal energy imparted into the workpiece from the ion beam during the implantation. The heated chuck, for example, comprises one or more heaters embedded therein, wherein the controller is configured to control a temperature of the one or more heaters.

The one or more heaters may comprise a plurality of heaters provided in a respective plurality of zones across the heated chuck. The plurality of zones, for example, may comprise an inner zone associated with a center of the heated chuck and an outer zone associated with a periphery of the heated chuck. The controller, for example, may be configured to individually control the plurality of heaters based, at least in part, on a location of the ion beam with respect to the inner zone and outer zone.

According to another example, the characterization of the ion implantation system comprises a mapping of temperature across a setup workpiece during an implantation of ions into the setup workpiece. The setup workpiece, for example, comprises a plurality of thermocouples disposed across a surface of the setup workpiece.

In accordance with another example, one or more of a backside gas source configured to provide a backside gas to an interface between the workpiece and the heated chuck, and a coolant source configured to provide a coolant fluid through one or more passages through the heated chuck is provided. The controller, for example, is further configured to control the one or more of the backside gas source and coolant source based, at least in part, on the characterization of the ion implantation system.

In some examples, the ion beam comprises one or more of a spot ion beam and a ribbon ion beam. In another example, the controller is configured to maintain the desired temperature of the workpiece during the implantation of ions into the workpiece within a desired accuracy of a temperature of the workpiece. The desired temperature, for example, is between approximately room temperature (RT) and approximately 1500° C. and the desired accuracy is within +/−5° C.

In accordance with another exemplary aspect of the present disclosure, a method for implanting ions into a workpiece in an ion implantation system is provided. The method, for example, comprises characterizing the ion implantation system with a predetermined set of parameters and providing a heated chuck at a first temperature. The workpiece, for example, is heated on the heated chuck to the first temperature and ions are implanted into the workpiece concurrent with heating the workpiece, wherein implanting ions into the workpiece further imparts thermal energy into the workpiece.

According to the exemplary method, a desired temperature of the workpiece is maintained during the implantation of ions into the workpiece by selectively heating the workpiece on the heated chuck to a second temperature. The second temperature, for example, is lower than the first temperature.

The desired temperature of the workpiece, for example, is maintained within a desired accuracy based, at least in part, on the characterization of the ion implantation system, wherein the thermal energy associated with implanting the ions into the workpiece is mitigated by the selective heating of the workpiece on the heated chuck at the second temperature. Characterizing the ion implantation system, for example, comprises mapping a temperature across a setup workpiece during an implantation of ions into the setup workpiece using the predetermined set of parameters, and maintaining the desired temperature of the workpiece during the implantation of ions into the workpiece may further comprise one or more selectively varying a flow of a backside gas to an interface between the workpiece and the heated chuck, and selectively providing a coolant fluid at a coolant temperature through one or more passages through the heated chuck.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
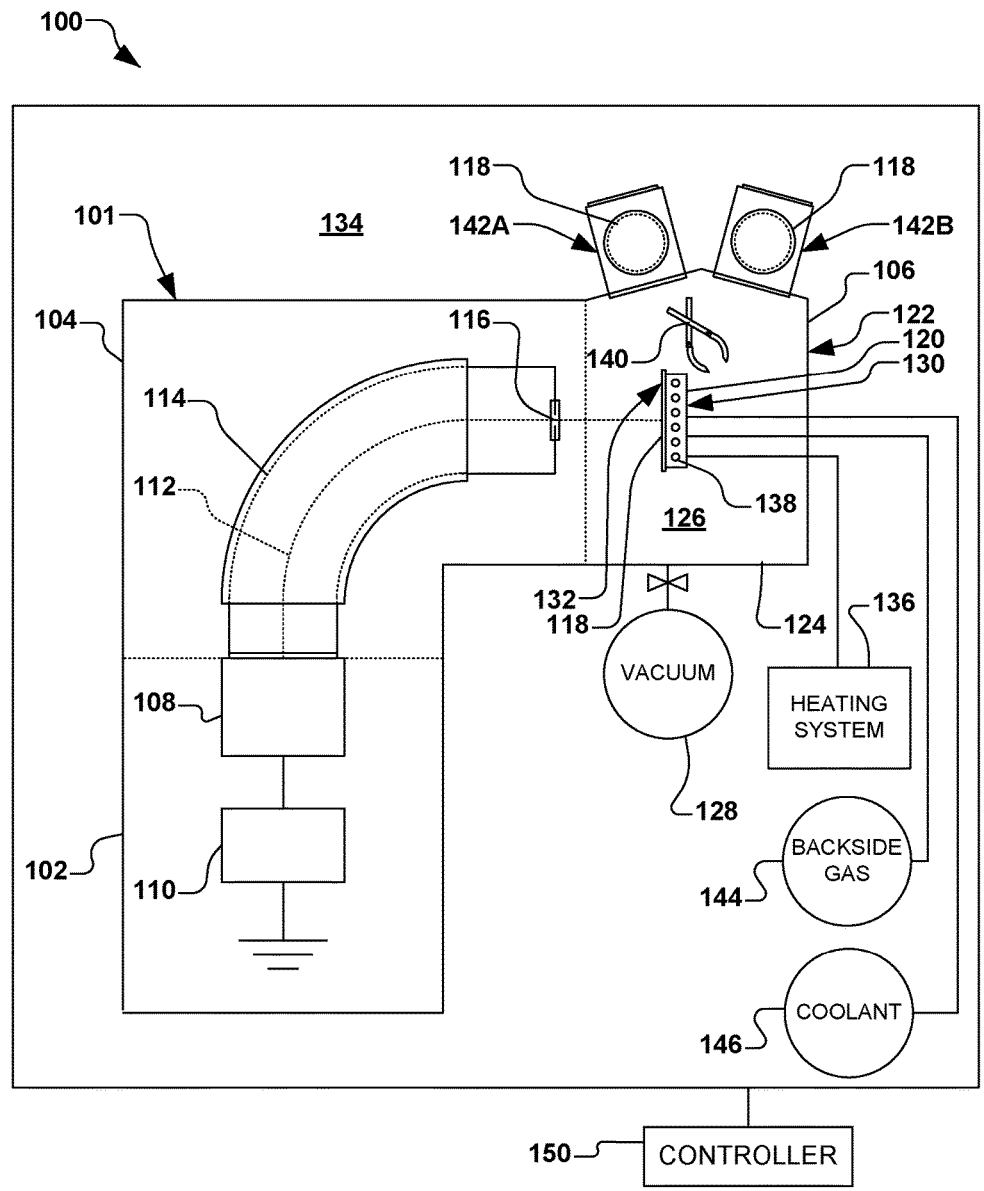
FIG. 1 illustrates schematic of an ion implantation system comprising in accordance with one example of the present invention.

The present disclosure is directed generally toward a system and method for controlling a temperature of a workpiece on a heated chuck, whereby the heated chuck is dynamically controlled based, at least in part, on a characterization of a power of an ion beam imparted on the workpiece. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

When implanting ions into a workpiece, accurate control of temperature of the workpiece during implantation is having greater significance as technology nodes evolve. Conventionally, control of the temperature of the workpiece is traditionally performed by controlling a temperature of a chuck on which the workpiece resides during the implant. For example, the chuck is heated to a fixed preset temperature via heaters embedded within the chuck. Accordingly, once placed on the chuck, the workpiece is heated to the fixed preset temperature by the heaters, and the implantation commences when the workpiece is at the fixed preset temperature.

The present disclosure presently appreciates that once the implantation commences, however, the temperature of the workpiece will increase due to the energy associated with the implantation, itself. In other words, the ion implantation carries an amount of implantation power along with it, whereby the implantation power further raises the temperature of the workpiece during the implant beyond the amount of heating provided by the chuck. The rise in temperature of the workpiece, for example, may differ significantly for various implantations, such as implantations using various powers, doses, energies, etc. As such, by conventionally setting the temperature of the chuck to the fixed preset temperature, the fixed preset temperature will no longer adequately maintain a desired accuracy of temperature control as the workpiece being implanted.

Accordingly, it is desirable to understand, per implant, the impact that the ion beam will have on the temperature of the workpiece. Temperatures of the workpiece are measured during implantation utilizing temperature measurement devices such as thermocouples (TCs), resistance temperature detectors (RTDs), or other temperature monitoring devices that are associated with the heaters embedded in the chuck, whereby the TCs indicate a temperature response of the chuck proximate to the respective heaters embedded in the chuck. However, by the time a temperature response of the workpiece due to implant energy reaches the TCs associated with the heaters, the workpiece that resides on the chuck may already be significantly over the desired implant temperature. Further, the workpiece is not typically perfectly thermally coupled to the chuck or embedded heater TCs, and there may be some amount of thermal resistance and lag time associated therewith. Thus, by the time the thermal energy actually reaches the temperature measurement device and a temperature is determined (e.g., by the TC or RTD), the temperature of the workpiece residing on the chuck may already be outside of an acceptable range.

Furthermore, accuracy of the control of the temperature of the workpiece has been considered to be acceptable if the workpiece temperature was held within approximately 50 degrees of a predetermined temperature. Heretofore, such control of the temperature of the workpiece has not significantly considered the energy imparted into the workpiece from the ion beam.

However, as technologies have evolved, greater accuracy in maintaining temperatures of the workpiece during implantation is being desired, such as maintaining accuracies within 15, 10, or even 5 degrees Celsius of the predetermined temperature. Further, as ion implantations increase in power, an impact that the power from the ion beam has on the temperature of the workpiece during implantation results in less accurate and less stable workpiece temperatures. Conventional thermocouples embedded within a heated chuck are generally slow to respond to energy from the ion beam, whereby the thermocouples are not thermally coupled close enough to the workpiece in order to allow for adjustments to the heater temperature that are fast enough or provide the accuracy presently desired.

Accordingly, the present disclosure provides a system and method in which thermal energy delivered to a workpiece in an ion implantation system is dynamically controlled by taking into consideration an amount of power imparted from an ion beam into the workpiece. In order to provide such control, the system is characterized for a given ion beam, whereby once characterized, the system takes into account an effect that the power from the ion beam will have on workpiece temperature during processing. For example, the characterization of the system can consider a particular material composition of the workpiece, as well as dimensions of the workpiece, such as diameter and thickness. Once the system is characterized for a particular workpiece and ion implantation, a control system is configured to control an input power to a heated chuck (e.g., via heater set points, backside gas pressures and flow rates, coolant flows through the heated chuck, coolant temperatures, etc.) to accordingly counteract temperature changes associated with the ion beam. Accordingly, a more accurate and more stable temperature of the workpiece can be attained throughout the ion implantation.

In order to gain a better understanding of the present disclosure, in accordance with one aspect, FIG. 1 illustrates an exemplary ion implantation system 100. The ion implantation system 100 in the present example comprises an exemplary ion implantation apparatus 101, however various other types of vacuum-based semiconductor processing systems are also contemplated, such as plasma processing systems, or other semiconductor processing systems. The ion implantation apparatus 101, for example, comprises a terminal 102, a beamline assembly 104, and an end station 106.

Generally speaking, an ion source 108 in the terminal 102 is coupled to a power supply 110 to ionize a dopant gas into a plurality of ions and to form an ion beam 112. The ion beam 112 in the present example is directed through a mass analysis apparatus 114, and out an aperture 116 towards the end station 106. In the end station 106, the ion beam 112 bombards a workpiece 118 (e.g., a substrate such as a silicon wafer, a display panel, etc.), which is selectively clamped or mounted to a chuck 120 (e.g., a mechanical grip chuck, an electrostatic chuck or ESC, or any apparatus configured to maintain a position of the workpiece). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber.

In one example, the ion implantation apparatus 101 is configured to provide a high temperature ion implantation, wherein the workpiece 118 is heated to a process temperature (e.g., approximately 200-600° C.). Thus, in the present example, the chuck 120 comprises a heated chuck 130, wherein the heated chuck is configured to support and retain the workpiece 118 on a clamping surface 132 thereof, while further permitting heating of the workpiece 118 within the process chamber 122 prior to, during, and/or after the exposure of the workpiece to the ion beam 112.

The heated chuck 130, for example, comprises an electrostatic chuck (ESC), a mechanically-gripped chuck, or any chucking or clamping apparatus configured to support the workpiece 118 while the workpiece is heated to a processing temperature that is considerably greater than an ambient or atmospheric temperature of the surroundings or external environment 134 (e.g., also called an "atmospheric environment"). For example, a heating system 136 may be further provided, wherein the heating system is configured to heat the heated chuck 130 (e.g., the clamping surface 132) and, in turn, the workpiece 118 residing thereon to the desired processing temperature. The heating system 136, for example, is configured to selectively heat the workpiece 118 via one or more heaters 138 disposed within the heated chuck 130. Alternatively, the one or more heaters 138 of the heating system 136 may comprise a radiant heat source (not shown), such as one or more of a halogen lamp, light emitting diode, and infrared thermal device that are external to the heated chuck 130.

A workpiece transfer system 140, for example, is further configured to transfer the workpiece 118 between the heated chuck 130 within the vacuum of the process environment 126 and one or more load lock chambers 142A, 1428 operatively coupled to the process chamber 122.

In order to enable an additional mechanism for heat transfer, the back side of the workpiece 118 is brought into conductive communication with the heated chuck 130. This conductive communication, for example, is achieved through a backside gas 144 (e.g., a pressure controlled gas interface) between the heated chuck 130 and the workpiece 118. Pressure of the backside gas 144, for example, is generally limited by the electrostatic force of the heated chuck 130, and can be generally kept in the range of 5-20 Torr. In one example, an interface thickness (e.g., the distance between the workpiece 118 and the heated chuck 130) associated with the backside gas 144 is controlled on the order of microns (typically 5-20 μm), and as such, the molecular mean free path in this pressure regime becomes large enough for the interface thickness to push the system into the transitional and molecular gas regime. Additionally, a coolant source 146 may be provided, whereby the coolant source is configured to selectively control a temperature and flow rate of a coolant through the heated chuck 130 for further temperature control of the heated chuck.

In accordance with another exemplary aspect, a controller 150 is further provided and configured to selectively control one or more components of the ion implantation system 100, such as the ion implantation apparatus 101, the heated chuck 130, the heating system 136, and the backside gas 144 to selectively control the temperature of the workpiece 118. The controller 150, for example, may be configured to heat the workpiece 118 to a predetermined temperature in the processing chamber 122 via the heated chuck 130 and heating system 136, to implant ions into the workpiece via the ion implantation apparatus 101, and to selectively transfer the workpiece between the external environment 134 (e.g., atmosphere) and the process environment 126 (e.g., a vacuum environment).

Various ion implantation systems 100 may be configured utilizing various electrostatic chucks 120 having differing configurations, whereby implants performed at different temperature ranges utilize respectively different electrostatic chucks having differing heat transfer capabilities. The system 100 of FIG. 1 of the present disclosure, however, may be configured to perform either or both high temperature implants (e.g., in the range of 200-1500° C.) and quasi-room temperature implants (e.g., in the range of 20-200° C.) by utilizing the heated chuck 130.

Absent countermeasures, during an ion implantation utilizing the ion implantation system 100, energy can build up on the workpiece 118 in the form of heat, as the charged ions collide with the workpiece. This heat can warp or crack the workpiece 118, which may render the workpiece worthless (or significantly less valuable) in some implementations. The heat can further cause the dose of ions delivered to the workpiece 118 to differ from the dosage desired, which can alter functionality from what is desired. For example, if a dose of $1 \times 10^{17}$ atoms/cm$^3$ are desired to be implanted in an extremely thin region just below the outer surface of the workpiece 118, unexpected heating could cause the delivered ions to diffuse out from this extremely thin region such that the dosage actually achieved is less than $1 \times 10^{17}$ atoms/cm$^3$. In effect, the undesired heating can "smear" the implanted charge over a larger region than desired, thereby reducing the effective dosage to less than what is desired. Other undesirable effects could also occur.

Thus, in accordance with one exemplary aspect, the ion implantation system 100 of the present disclosure is configured to determine and preemptively adjust or otherwise control the temperature at the workpiece 118 based on the energy associated with the ion beam 112 that the workpiece is being exposed to. As such, a job recipe may be formulated for the ion implantation system 100 for various ion implantation energies, various workpieces 118, or other configurations. The present disclosure, for example, advantageously recognizes that with a predetermined power (e.g., 500 W) from the ion beam 112 during an implantation, a temperature increase at the workpiece 118 may be observed, even though the one or more heaters 138 associated with the heated chuck 130 are set to heat the heated chuck to a predetermined temperature (e.g., 200° C.). As such, the present disclosure may advantageously lower the predetermined temperature (e.g., 180° C.) of the heated chuck 130, since the ion beam 112 implanting the workpiece 130 may have a beam power that raises the workpiece temperature an additional amount (e.g., 20° C.), thus maintaining the predetermined temperature (e.g., 200° C.) at the workpiece for the implant.

Accordingly, the present disclosure provides an active control of temperature of the workpiece 118. For example, at the beginning of the implant, the one or more heaters 138 in the heated chuck 130 may be set to a first temperature (e.g., 200° C.), whereby the first temperature is lowered through the progression of the implant to a second temperature (e.g., 180° C.). As such, power applied to the one or more heater 138 in the heated chuck 130 is lowered to account for the power imparted to the workpiece 118 from the ion beam 112. For example, a control of both the power applied to the one or more heaters 138 and the power of the ion beam 112 may be controlled by the controller 150, thus advantageously resulting in a more accurate workpiece temperature than previously seen. It should be noted that while a first temperature and second temperature are described, it shall be understood that a multitude of temperatures may be varied throughout an implant for continuous control through a range of temperatures.

The power applied to the one or more heaters 138, for example, may be generally applied to the entire heated chuck 130, or the power may be localized. For example, instead of a single heater 138 being utilized for the entire heated chuck 130, a plurality of heaters 138 may be implemented, whereby localized temperature control may be achieved. Such localization of temperature control, for example, may be based on the type of ion beam 112 that the workpiece 118 is exposed to. For example, an ion beam 112 in the form of a scanned spot or ribbon ion beam may include a first characterization of the power input from the ion beam 112 associated with a location of the ion beam on the workpiece 118, whereby the control of the one or more heaters 138 may be based on the first characterization of the power input and location of the ion beam across the workpiece.

Alternatively, an average temperature across the workpiece 118 may be maintained within a certain range. For example, an exposure of the workpiece 118 to the ion beam 112 in the form of a spot ion beam at one location on the workpiece may heat another location on the workpiece via thermal conduction through the workpiece, whereby the conduction distributes the variation in temperature. When implanting an entire workpiece 118, for example, an average temperature of the workpiece may be attained as close as possible to the desired temperature.

The one or more heaters 138 of the heated chuck 130, for example, may comprise a heater trace (e.g., a resistive heater wire) that is configured to provide a uniform temperature across the workpiece 118. As such, geometries, etc. of the workpiece 118 or heated chuck 130 are considered in the characterization of the ion implantation system 100 in to provide the uniform temperature.

However, during the implantation, an overall temperature of the workpiece 118 may begin to drift as the ion beam 112 is scanned across the diameter of the workpiece, whereby the ion beam power is input to the workpiece at varying locations. The present disclosure may further provide an adjustment to one or more heaters 138 provided in a plurality of zones across the heated chuck 130. For example, in having two zones (e.g., an inner zone and an outer zone) for heating in the heated chuck 130, the present disclosure may determine that, as the implant power imparts energy to the outer zone, the temperature of the heater 138 associated with the outer zone is decreased, and when the implant power imparts energy to the inner zone, the temperature of the heater associated with the inner zone is decreased to provide a more uniform temperature profile.

In theory, if the workpiece 118 is well-thermally coupled to a temperature measurement device associated with the heater 138, such as a thermocouple, then a fast response may be attained. However, in practice, thermocouples associated with the heaters 138 are embedded in the heated chuck 130 and are generally decoupled from the workpiece 118 in order to prevent particle contamination. As such, by the time a temperature change at the workpiece 118 reaches the thermocouple, the temperature of the workpiece is already too high to respond with lowering of the temperature of the heater 138. Accordingly, the present disclosure contemplates a preemptive time lag (e.g., 10 seconds into the implant) based, at least in part, on the characterization of the system 100 to decrease power to the one or more heaters 138 so that desired temperature is maintained evenly across the workpiece 118.

Accordingly, the one or more heater 138 are controlled based on a process recipe and/or a knowledge of the temperature increase accorded to the ion beam 112. The control of the one or more heaters 138, for example, may be accomplished by directly controlling a heater power supplied by the heating system 136 to the one or more heaters 138, controlling the backside gas 144, a flow of coolant 146 through the ESC, temperature of the coolant, or by other manners. For example, a set point for power being applied to the one or more heater 138 may be controlled to account for the temperature increase from the ion beam 112 and to provide the desired temperature of the workpiece 118. One or more of the backside gas 144, and flow and/or temperature of the coolant 146 may be further controlled to provide the desired temperature of the workpiece 118. The present disclosure further contemplates that the power to the one or more heaters 138, for example, may anticipate a predetermined lag time to account for heat dissipation and/or heat build-up in the workpiece 118.

In order to maintain a desired temperature of the workpiece 118, for example, an understanding of thermal loss (also referred to as power loss or temperature loss) may be further desired, as maintaining the desired temperature may be difficult to attain by power input, alone. Accordingly, the coolant 146 flowed through one or more coolant loops in the heated chuck 138 are configured to remove thermal energy from the heated chuck, whereby the coolant loops permit further control of the the temperature of the heated chuck. As such, power or thermal energy is added and removed in order to maintain a quasi-equilibrium.

Accordingly, the present disclosure characterizes the ion implantation system 100 in order to determine an amount of time taken for the temperature of the workpiece 118 to increase due to energy imparted from the ion beam 112, and to determine how quickly a response by the one or more heaters 138 can adequately compensate for the increase in temperature. Such a characterization, for example, can be determined based on the beam power, length of the implant, and energy of the implant. The characterization of the system 100, for example, can generally vary for each ion implantation system, type of implant (e.g., type and energy of ions implanted), configuration of the workpiece 118, etc., whereby variations in flows, geometries, radiative losses, etc. may be accounted for in each characterization. Thus, a response to the ion beam 112 may be characterized by process recipe for any given energy and power from the ion beam, as well as configuration of the workpiece 118.

In accordance with one example, a predetermined power of the ion beam 112 may be provided for a predetermined implant process recipe using the ion implantation system 100, whereby the ion implantation system is characterized, as discussed above. Accordingly, the present disclosure actively controls the heating of the workpiece 118 through the heated chuck 130 concurrent with the implantation in order to provide a uniform and accurate temperature at the workpiece. Uniformity of the implantation, for example, may be associated with the temperature difference witnessed across the workpiece 118. In one example implant, 500 W of power to the one or more heaters 138 may be provided to maintain the workpiece at 200° C. If, for example, an additional 200 W of power is added to the workpiece 118 from the ion beam 112, then the workpiece temperature will increase to be above the desired implant temperature of 200° C. Accordingly, the present disclosure advantageously decreases the power to the one or more heaters 138 (e.g., decrease the power by 200 W) to account for the power imparted from the ion beam, thereby providing a more accurate and stable temperature at the workpiece 118.

As stated previously, thermocouples in the heated chuck 130 may be considered as being generally de-coupled from the workpiece 118, whereby the thermocouples in the heated chuck are intended to provide an indication of a temperature of the heated chuck, but do not provide a direct temperature measurement of the workpiece. For example, the heated chuck 130 may be heated to a predetermined temperature (e.g., 200° C.), whereby the thermocouples in the heated chuck directly provides feedback to control the temperature of the one or more heaters 138. When an ion implantation commences, however, since the thermocouples are embedded in the heated chuck 130, additional energy imparted to the workpiece 118 from the implantation is not registered at the thermocouples until the energy passes through the workpiece 118 and into the material of the heated chuck proximate to the one or more heaters 138. By the time the additional energy from the implantation is recorded by the thermocouple in the heated chuck for control of the one or more heaters 138, the temperature of the workpiece 118 may have already exceeded a desired processing temperature, thus limiting an accuracy of temperature control during the implantation.

Thus, in one example, the ion implantation system 100 is characterized, whereby for any given implant, a dose, implantation time, implantation energy, and total power of the ion beam 112 is determined. For example, an implantation may be characterized for an amount of time which the ion beam 112 impacts the workpiece 118 at a predetermined power via a workpiece 118 that is configured as a setup workpiece (e.g., a non-production workpiece used for characterization), whereby the setup workpiece, for example, may have one or more thermocouples embedded therein. The setup workpiece, for example, is implanted at the predetermined power, and wherein the one or more thermocouples embedded therein provide an indication of how much power is actually imparted into the workpiece 118 from the ion beam 112 during the implantation.

The present disclosure appreciates that, heretofore, the temperature of a workpiece being implanted has been assumed to generally correspond to the temperature of the chuck on which it resides. However, such an assumption of workpiece temperature does not account for power imparted to the workpiece via the ion beam, which also influences the temperature of the workpiece during implantation. Thus, in accordance with the present disclosure, a desired accuracy of a temperature (e.g., +/−5° C.) of the workpiece 118 may be attained during the ion implantation, whereby the ion implantation may be further controlled based on the desired accuracy. The present disclosure further takes into consideration the power of the ion beam 112 in controlling the temperature of the heated chuck 130 and workpiece 118.

According to one example, the ion implantation system 100 is characterized for a first set of desired ion implantation parameters. For example, the first set of desired ion implantation parameters may comprise a desired workpiece temperature (e.g., 200° C.). A process recipe may be further ascertained as part of the first set of desired ion implantation parameters, whereby a desired temperature of the heated chuck 138 and a desired power of the ion beam 112 is determined. According to the present disclosure, the temperature of the heated chuck 138 may be actively controlled during the ion implantation, whereby the control of the temperature of the heated chuck is based, at least in part, on the energy imparted into the workpiece 118 from the ion beam 112. The present disclosure thus advantageously provides a method to account for energy (e.g., thermal energy) that is transferred into or out of the workpiece 118 from the ion beam 112 and thus controls the temperature of the workpiece during implantation through control of one or more of backside gas 144 (e.g., backside gas pressure), temperature setpoints of the heated chuck 138, temperature of the coolant 146, and flow of the coolant through the heated chuck, wherein the control of the temperature of the workpiece is based, at least in part, on a characterization of the implant energy imparted to the workpiece from the ion beam.

Figure 2:
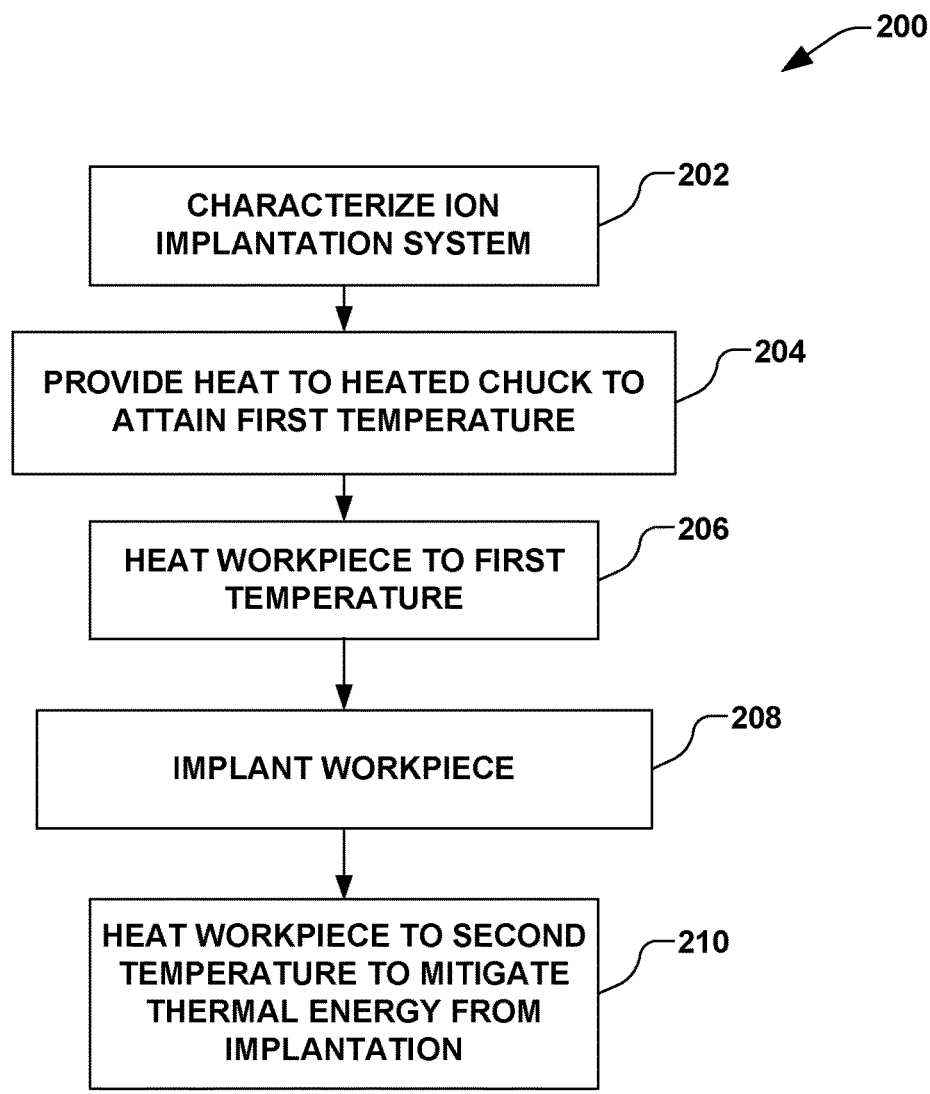
FIG. 2 illustrates an exemplary method for maintaining a temperature of a workpiece during ion implantation according to another exemplary aspect of the invention.

In accordance with another exemplary aspect of the invention, FIG. 2 illustrates an exemplary method 200 for controlling a temperature of a workpiece during ion implantation. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 200 of FIG. 2 begins at act 202, wherein an ion implantation system is characterized using a predetermined set of parameters. The predetermined set of parameters, for example, may comprise a process recipe and a desired power of the ion beam. In act 204, a heated chuck is heated to a first temperature. In act 206, for example, the workpiece is heated on the heated chuck to the first temperature, and ions are implanted into the workpiece in act 208 concurrent with heating the workpiece. Concurrent with the heating and implanting of ions into the workpiece in acts 206 and 208, thermal energy associated with the ion implantation is imparted into the workpiece.

In act 210, a desired temperature of the workpiece is maintained during the implantation of ions into the workpiece by selectively heating the workpiece on the heated chuck to a second temperature. It is noted that acts 208 and 210 may be performed generally concurrently. The desired temperature, for example, is maintained within a desired accuracy based, at least in part, on the characterization of the ion implantation system. The desired temperature, for example, may be alternatively or additionally maintained in act 210 based on measurements or other analyses performed to determine a thermal impact of the ion beam on the workpiece in the ion implantation system. Accordingly, the thermal energy associated with implanting the ions into the workpiece is mitigated by the selective heating of the workpiece on the heated chuck at the second temperature.

In one example, the second temperature is lower than the first temperature. In another example, the first temperature is between approximately 100° C. and approximately 300° C. and the desired accuracy is within +/−5° C.

According to one example, characterizing the ion implantation system in act 202 comprises mapping a temperature across a setup workpiece during an implantation of ions into the setup workpiece using the predetermined set of parameters. The setup workpiece, for example, may comprise a plurality of thermocouples disposed across a surface of the setup workpiece.

In another example, maintaining the desired temperature of the workpiece during the implantation of ions into the workpiece further comprises one or more selectively varying a flow of a backside gas to an interface between the workpiece and the heated chuck, and selectively providing a coolant fluid at a coolant temperature through one or more passages through the heated chuck.

Figure 3:
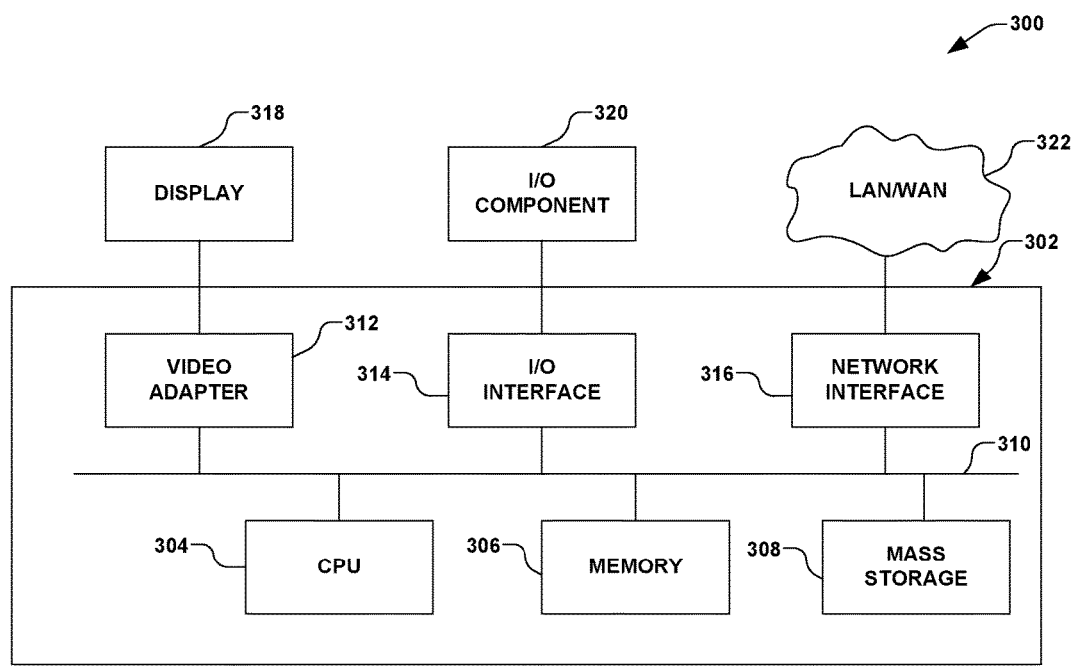
FIG. 3 is a block diagram illustrating an exemplary control system in accordance with another aspect.

In accordance with another aspect, the aforementioned methodology may be implemented using computer program code in one or more of a controller, general purpose computer, or processor based system. As illustrated in FIG. 3, a block diagram is provided of a processor based system 300 in accordance with another embodiment. The processor based system 300 is a general purpose computer platform and may be used to implement processes discussed herein. The processor based system 300 may include a processing unit 302, such as a desktop computer, a workstation, a laptop computer, or a dedicated unit customized for a particular application. The processor based system 300 may be equipped with a display 318 and one or more input/output devices 320, such as a mouse, a keyboard, or printer. The processing unit 302 may include a central processing unit (CPU) 304, memory 306, a mass storage device 308, a video adapter 312, and an I/O interface 314 connected to a bus 310.

The bus 310 may be one or more of any type of several bus architectures including a memory bus or memory controller, a peripheral bus, or video bus. The CPU 304 may include any type of electronic data processor, and the memory 306 may include any type of system memory, such as static random access memory (SRAM), dynamic random access memory (DRAM), or read-only memory (ROM).

The mass storage device 308 may include any type of storage device configured to store data, programs, and other information and to make the data, programs, and other information accessible via the bus 310. The mass storage device 308 may include, for example, one or more of a hard disk drive, a magnetic disk drive, an optical disk drive, or any non-transitory computer-readable medium.

The video adapter 312 and the I/O interface 314 provide interfaces to couple external input and output devices to the processing unit 302. Examples of input and output devices include the display 318 coupled to the video adapter 312 and the I/O device 320, such as a mouse, keyboard, printer, and the like, coupled to the I/O interface 314. Other devices may be coupled to the processing unit 302, and additional or fewer interface cards may be utilized. For example, a serial interface card (not shown) may be used to provide a serial interface for a printer. The processing unit 302 also may include a network interface 316 that may be a wired link to a local area network (LAN) or a wide area network (WAN) 322 and/or a wireless link.

It should be noted that the processor based system 300 may include other components. For example, the processor based system 300 may include power supplies, cables, a motherboard, removable storage media, cases, and the like. These other components, although not shown, are considered part of the processor based system 300.

Embodiments of the present disclosure may be implemented on the processor based system 300, such as by program code executed by the CPU 304. Various methods according to the above-described embodiments may be implemented by program code. Accordingly, explicit discussion herein is omitted.

Further, it should be noted that various modules and devices in FIG. 1 may be implemented on and controlled by one or more processor based systems 300 of FIG. 3. Communication between the different modules and devices may vary depending upon how the modules are implemented. If the modules are implemented on one processor based system 300, data may be saved in memory 306 or mass storage 308 between the execution of program code for different steps by the CPU 304. The data may then be provided by the CPU 304 accessing the memory 306 or mass storage 308 via bus 310 during the execution of a respective step. If modules are implemented on different processor based systems 300 or if data is to be provided from another storage system, such as a separate database, data can be provided between the systems 300 through I/O interface 314 or network interface 316. Similarly, data provided by the devices or stages may be input into one or more processor based systems 300 by the I/O interface 314 or network interface 316. A person having ordinary skill in the art will readily understand other variations and modifications in implementing systems and methods that are contemplated within the scope of varying embodiments.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion implantation system, comprising:
an ion source configured to form an ion beam;
a beamline assembly configured to mass analyze the ion beam;
an end station for receiving the ion beam, wherein the end station comprises a heated chuck configured to selectively secure and selectively heat a workpiece during an implantation of ions into the workpiece from the ion beam; and
a controller configured to maintain a desired temperature of the workpiece during the implantation of ions into the workpiece, wherein the controller is configured to selectively heat the workpiece via a control of the heated chuck based, at least in part, on a predetermined characterization of the ion implantation system and a thermal energy imparted into the workpiece from the ion beam during the implantation.

2. The ion implantation system of claim 1, wherein the heated chuck comprises one or more heaters embedded therein, wherein the controller is configured to control a temperature of the one or more heaters.

3. The ion implantation system of claim 2, wherein the one or more heaters comprise a plurality of heaters provided in a respective plurality of zones across the heated chuck.

4. The ion implantation system of claim 3, wherein the plurality of zones comprise an inner zone associated with a center of the heated chuck and an outer zone associated with a periphery of the heated chuck, wherein the controller is configured to individually control the plurality of heaters based, at least in part, on a location of the ion beam with respect to the inner zone and outer zone.

5. The ion implantation system of claim 1, wherein the characterization of the ion implantation system comprises a mapping of temperature across a setup workpiece during an implantation of ions into the setup workpiece.

6. The ion implantation system of claim 5, wherein the setup workpiece comprises a plurality of thermocouples disposed across a surface of the setup workpiece.

7. The ion implantation system of claim 1, further comprising one or more of a backside gas source configured to provide a backside gas to an interface between the workpiece and the heated chuck, and a coolant source configured to provide a coolant fluid through one or more passages through the heated chuck, wherein the controller is further configured to control the one or more of the backside gas source and coolant source based, at least in part, on the characterization of the ion implantation system.

8. The ion implantation system of claim 1, wherein the ion beam comprises one or more of a spot ion beam and a ribbon ion beam.

9. The ion implantation system of claim 1, wherein the controller is configured to maintain the desired temperature of the workpiece during the implantation of ions into the workpiece within a desired accuracy of a temperature of the workpiece.

10. The ion implantation system of claim 9, wherein the desired temperature is between approximately 20° C. and approximately 1500° C. and the desired accuracy is within +/−5° C.

11. A method for implanting ions into a workpiece in an ion implantation system, the method comprising:
characterizing the ion implantation system with a predetermined set of parameters;
providing a heated chuck at a first temperature;
heating the workpiece on the heated chuck to the first temperature;
implanting ions into the workpiece concurrent with heating the workpiece, wherein implanting ions into the workpiece imparts thermal energy into the workpiece; and
maintaining a desired temperature of the workpiece during the implantation of ions into the workpiece by selectively heating the workpiece on the heated chuck to a second temperature, wherein the desired temperature is maintained within a desired accuracy and is based at least in part, on the characterization of the ion implantation system, wherein the thermal energy associated with implanting the ions into the workpiece is mitigated by the selective heating of the workpiece on the heated chuck at the second temperature.

12. The method of claim 11, wherein the second temperature is lower than the first temperature.

13. The method of claim 11, wherein the first temperature is between approximately 20° C. and approximately 1500° C. and the desired accuracy is within +/−5° C.

14. The method of claim 11, wherein characterizing the ion implantation system comprises mapping a temperature across a setup workpiece during an implantation of ions into the setup workpiece using the predetermined set of parameters.

15. The method of claim 14, wherein the setup workpiece comprises a plurality of thermocouples disposed across a surface of the setup workpiece.

16. The method of claim 11, wherein maintaining the desired temperature of the workpiece during the implantation of ions into the workpiece further comprises one or more selectively varying a flow of a backside gas to an interface between the workpiece and the heated chuck, and selectively providing a coolant fluid at a coolant temperature through one or more passages through the heated chuck.

17. The method of claim 11, wherein the ion beam comprises one or more of a spot ion beam and a ribbon ion beam.

18. The method of claim 11, wherein the predetermined set of parameters comprise a process recipe and a desired power of the ion beam.

* * * * *